United States Patent
Lee et al.

(10) Patent No.: US 8,659,323 B2
(45) Date of Patent: Feb. 25, 2014

(54) FREQUENCY SYNTHESIZER, METHOD OF GENERATING OUTPUT FREQUENCY THEREOF AND METHOD OF CORRECTING CONVERSION GAIN THEREOF

(75) Inventors: Sang-Gug Lee, Daegu (KR); Seungjin Kim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 156 days.

(21) Appl. No.: 13/250,037

(22) Filed: Sep. 30, 2011

(65) Prior Publication Data

US 2012/0306542 A1    Dec. 6, 2012

(30) Foreign Application Priority Data

Apr. 18, 2011    (KR) ........................ 10-2011-0035836

(51) Int. Cl.
*H03B 21/00*    (2006.01)

(52) U.S. Cl.
USPC ......................................................... 327/105

(58) Field of Classification Search
USPC ......................................... 327/105, 100, 165
See application file for complete search history.

(56) References Cited

U.S. PATENT DOCUMENTS

| | | | |
|---|---|---|---|
| 6,690,215 B2 * | 2/2004 | McCune et al. | 327/156 |
| 6,844,758 B2 * | 1/2005 | Smith | 327/105 |
| 6,870,409 B2 * | 3/2005 | Lee | 327/147 |
| 8,369,476 B2 * | 2/2013 | Tseng et al. | 377/47 |
| 8,384,450 B2 * | 2/2013 | Kuramochi | 327/156 |

FOREIGN PATENT DOCUMENTS

| | | |
|---|---|---|
| JP | 2003-046389 A | 2/2003 |
| JP | 2005-175780 A | 6/2005 |
| JP | 2010-098704 A | 4/2010 |
| KR | 10-2006-0045139 A | 5/2006 |

* cited by examiner

*Primary Examiner* — Hai L Nguyen
(74) *Attorney, Agent, or Firm* — Lexyoume IP Meister, PLLC.

(57) ABSTRACT

A frequency synthesizer includes: a delta sigma modulator that outputs an input value to a sequentially changing digital value; an analog path unit that converts the digital value to an analog value according to a first conversion gain; an accumulator that accumulates a difference between the input and digital values; a digital to analog converter (DAC) that compensates an output value of the accumulator according to a second conversion gain; a correction loop that extracts analog tendency by adding an output of the analog path unit and an output of the DAC and that extracts digital tendency from an output of the accumulator and adjusts the second conversion gain by comparing the analog and digital tendency; and a voltage control oscillator that generates an output frequency by adding an output of the analog path unit and an output according to an adjusted second conversion gain of the DAC.

15 Claims, 8 Drawing Sheets

→ Digital path
→ Analog path

FREQUENCY SYNTHESIZER, METHOD OF GENERATING OUTPUT FREQUENCY THEREOF AND METHOD OF CORRECTING CONVERSION GAIN THEREOF

CROSS-REFERENCE TO RELATED APPLICATION

This application claims priority to and the benefit of Korean Patent Application No. 10-2011-0035836 filed in the Korean Intellectual Property Office on Apr. 18, 2011, the entire contents of which are incorporated herein by reference.

BACKGROUND OF THE INVENTION (a) Field of the Invention

The present invention relates to a frequency synthesizer, a method of generating an output frequency thereof, and a method of correcting a conversion gain thereof.

(b) Description of the Related Art

A process of converting an analog signal to a digital signal is referred to as an analog to digital conversion. It is one of the most important performances of analog-digital conversion how accurately an analog signal can be converted to a digital signal.

A delta-sigma modulator (DSM) performs oversampling of an analog input signal and converts an oversampled input signal to a 1-bit digital bit or multi-bit digital data through delta-sigma modulation.

A frequency synthesizer using a DSM may have a deteriorated performance by quantization noise that is generated in the DSM.

A method of removing quantization noise includes a method of using a digital to analog converter (DAC). Thereby, a pattern of quantization noise that is generated in a DSM may be calculated using a DAC, and the calculated pattern may be compensated in an analog output that passes through a frequency divider, a phase detector, and a charge pump.

Here, a DAC is a circuit that converts a digital signal to an analog signal, and a conversion gain is changed according to whether a least significant bit (LSB) is set to which value. Because a removing degree of quantization noise is determined according to a conversion gain, a method of optimally making a conversion gain is necessary.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a frequency synthesizer, a method of generating an output frequency thereof, and a method of correcting a conversion gain thereof.

An exemplary embodiment of the present invention provides a frequency synthesizer includes: a delta sigma modulator that outputs an input value to a sequentially changing digital value; an analog path unit that converts the digital value to an analog value according to a first conversion gain; an accumulator that accumulates a difference between the input value and the digital value; a DAC that compensates an output value of the accumulator according to a second conversion gain; a correction loop that extracts analog tendency by adding an output of the analog path unit and an output of the DAC and that extracts digital tendency from an output of the accumulator and that adjusts the second conversion gain by comparing the analog tendency and the digital tendency; and a voltage control oscillator that generates an output frequency by adding an output of the analog path unit and an output according to an adjusted second conversion gain of the DAC.

The correction loop may include an analog tendency extractor that extracts the analog tendency; a digital tendency extractor that extracts digital tendency; and a correction unit that adjusts the second conversion gain so that the first conversion gain and the second conversion gain become the same by comparing the analog tendency and the digital tendency.

The correction unit may increase the second conversion gain, if the analog tendency and the digital tendency are not equal and reduce the second conversion gain, if the analog tendency and the digital tendency are equal.

The correction unit may compare the analog tendency and the digital tendency using an exclusive OR (XOR) operation.

The analog tendency extractor may extract the analog tendency by comparing a present value and an average value of the sum of an output of the analog path unit and an output of the DAC.

The digital tendency extractor may extract the digital tendency by comparing a present output and an average output of the accumulator.

Another embodiment of the present invention provides a method of generating an output frequency of a frequency synthesizer, the method including: outputting an input value to a sequentially changing digital value; converting the digital value to an analog value according to a first conversion gain; accumulating a difference between the input value and the digital value; compensating the accumulated value according to a second conversion gain; correcting the second conversion gain using analog tendency that is extracted from the analog value and a compensated value according to the second conversion gain and digital tendency that is extracted from the accumulated value; and generating an output frequency using the analog value and a compensated value according to a corrected second conversion gain.

The correcting of the second conversion gain may include extracting the analog tendency by adding the analog value and a compensated value according to the second conversion gain; extracting digital tendency from the accumulated value; and adjusting the second conversion gain so that the first conversion gain and the second conversion gain may become the same by comparing the analog tendency and the digital tendency.

The adjusting of the second conversion gain may include comparing the analog tendency and the digital tendency; increasing, if the analog tendency and the digital tendency are not equal, the second conversion gain, and reducing, if the analog tendency and the digital tendency are equal, the second conversion gain.

The comparing of the analog tendency may include performing an XOR operation of the analog tendency and the digital tendency.

Yet another embodiment of the present invention provides a method of correcting a conversion gain of a frequency synthesizer, the method including: generating an analog value from a digital value that is output from a delta sigma modulator; generating a compensation value from the digital value using a predetermined conversion gain of a DAC; extracting analog tendency from the analog value and the compensation value; extracting digital tendency from the digital value; and correcting a conversion gain of the DAC from the analog tendency and the digital tendency.

The correcting of a conversion gain may include increasing, if the analog tendency and the digital tendency are not equal, the conversion gain, and reducing, if the analog tendency and the digital tendency are equal, the conversion gain.

The correcting of a conversion gain may include comparing the analog tendency and the digital tendency using an XOR operation.

The extracting of the analog tendency may include extracting the analog tendency by comparing a present value and an average value of the sum of the analog value and the compensation value.

The extracting of digital tendency may include extracting the digital tendency by comparing a present value and an average value of the digital value.

DETAILED DESCRIPTION OF THE EMBODIMENTS

Figure 1:
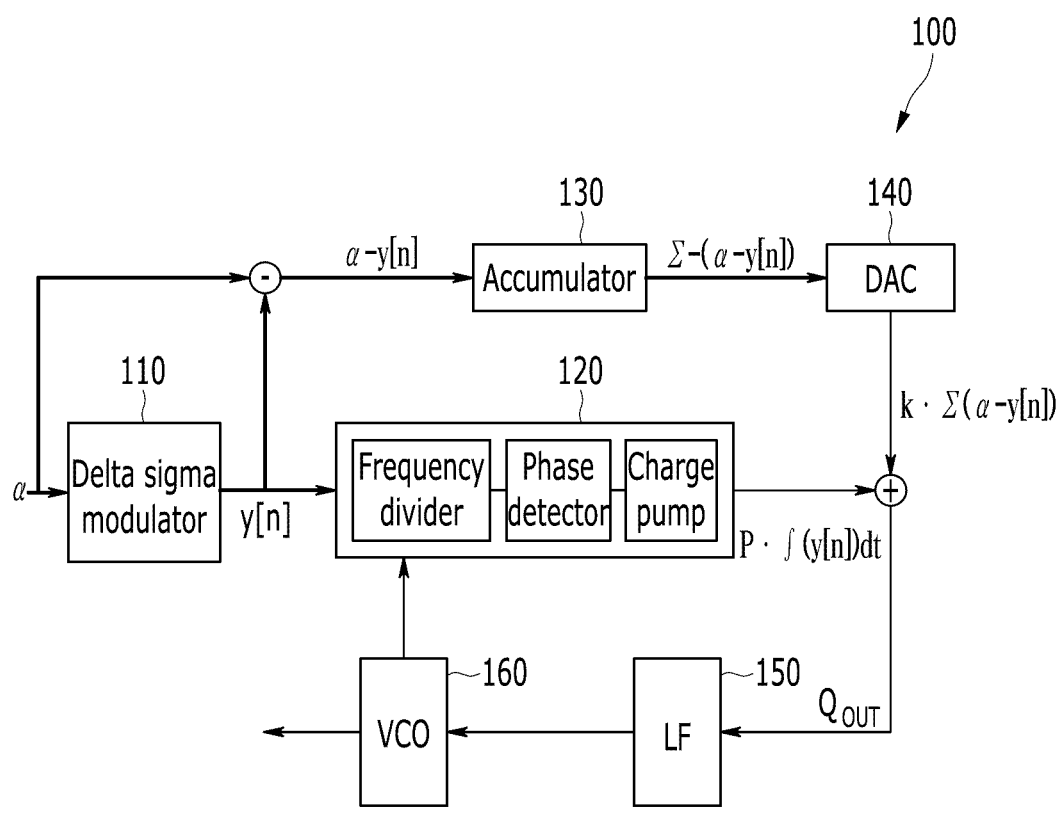
FIG. 1 is a diagram illustrating a method of removing quantization noise using a DAC in a frequency synthesizer using a delta sigma modulator.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, in the entire specification, unless explicitly described to the contrary, the word "comprise" and variations such as "comprises" or "comprising", will be understood to imply the inclusion of stated elements but not the exclusion of any other elements.

FIG. 1 is a diagram illustrating a method of removing quantization noise using a DAC in a frequency synthesizer 100 using a delta sigma modulator.

Figure 2:
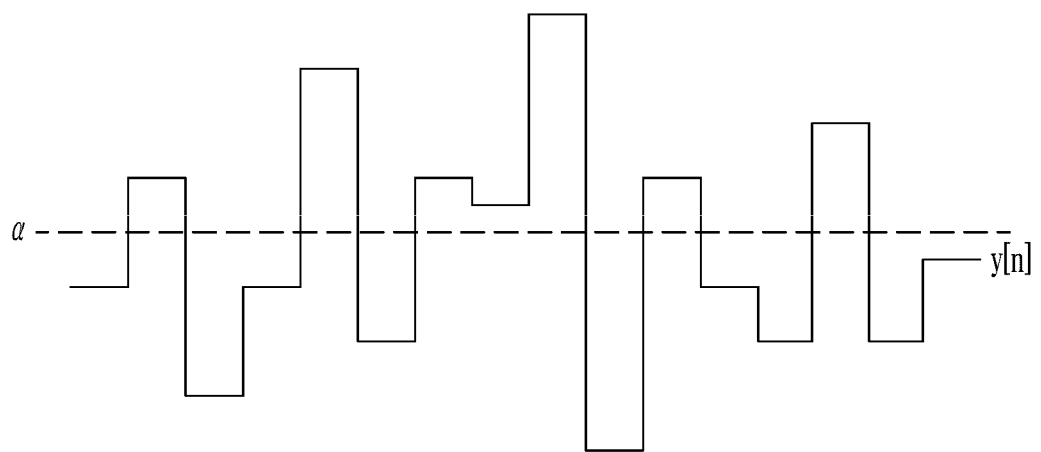
FIG. 2 illustrates sequentially changing y[n] in the frequency synthesizer of FIG. 1.

Referring to FIG. 1, when α (0≤α≤1) is input to a delta sigma modulator 110, the delta sigma modulator 110 outputs y[n], which is a random sequentially changing digital value. FIG. 2 illustrates sequentially changing y[n] in the frequency synthesizer 100 of FIG. 1. Here, a may be obtained again from an average value of sequentially changing y[n]. In this way, when y[n] becomes an output of the delta sigma modulator 110, quantization noise is generated.

Y[n] that is output from the delta sigma modulator 110 passes through each of an analog path and a digital path.

The analog path passes through a frequency divider, a phase detector, and a charge pump. In this specification, an element including a frequency divider, a phase detector, and a charge pump may be referred to as an analog path unit 120. In view of characteristics of the frequency divider, y[n] that is input to the analog path unit 120 has a function of an integral function to a time and is output to p·∫y[n]dt. Here, p is a conversion gain for allowing y[n], which is a digital value to have an analog value. P may be changed according to an output frequency of the frequency synthesizer, a current of a charge pump, and an outer process-voltage-temperature (PVT).

After an output y[n] of the delta sigma modulator 110 is subtracted from an input α of the delta sigma modulator 110 in a digital path, k·Σ(α−y[n]) is output via an accumulator 130 and a DAC 140. Here, the accumulator 130 is a block that is inserted to correspond to a frequency divider having an integral function in an analog path. K is a conversion gain of the DAC 140.

When signals that are output via each of the analog path and the digital path are added, the signals are represented by Equation 1.

$$Q_{OUT} = p \cdot \int y[n]dt + k \cdot \sum (\alpha - y[n]) \quad \text{(Equation 1)}$$
$$= k \cdot \sum \alpha + p \cdot \int y[n]dt - k \cdot \sum (y[n])$$
$$\cong k \cdot \sum \alpha + \sum (y[n])(p-k)$$

Thereafter, $Q_{OUT}$ is input to a loop filter (LF) 150, and a voltage value that is output from the LF 150 is applied to a voltage control oscillator (VCO) 160 and thus an output frequency is generated.

In this case, in Equation 1, if a conversion gain p of the analog path and a conversion gain k of the digital path are equal, an output value of the LF 150 is represented by Equation 2.

$$Lout = k \cdot \Sigma \alpha \quad \text{(Equation 2)}$$

In Equation 2, if p and k are equal, only a static value that does not sequentially change is output from the LF 150 and thus it can be seen that quantization noise is not generated.

However, because p is a value changing according to an external factor, it is not easy to set p to be equally to k, which is a fixed value.

Therefore, according to an exemplary embodiment of the present invention, a method of adjusting k, which is a conversion gain of the digital path according to p, which is a conversion gain of the analog path is suggested.

Figure 3:
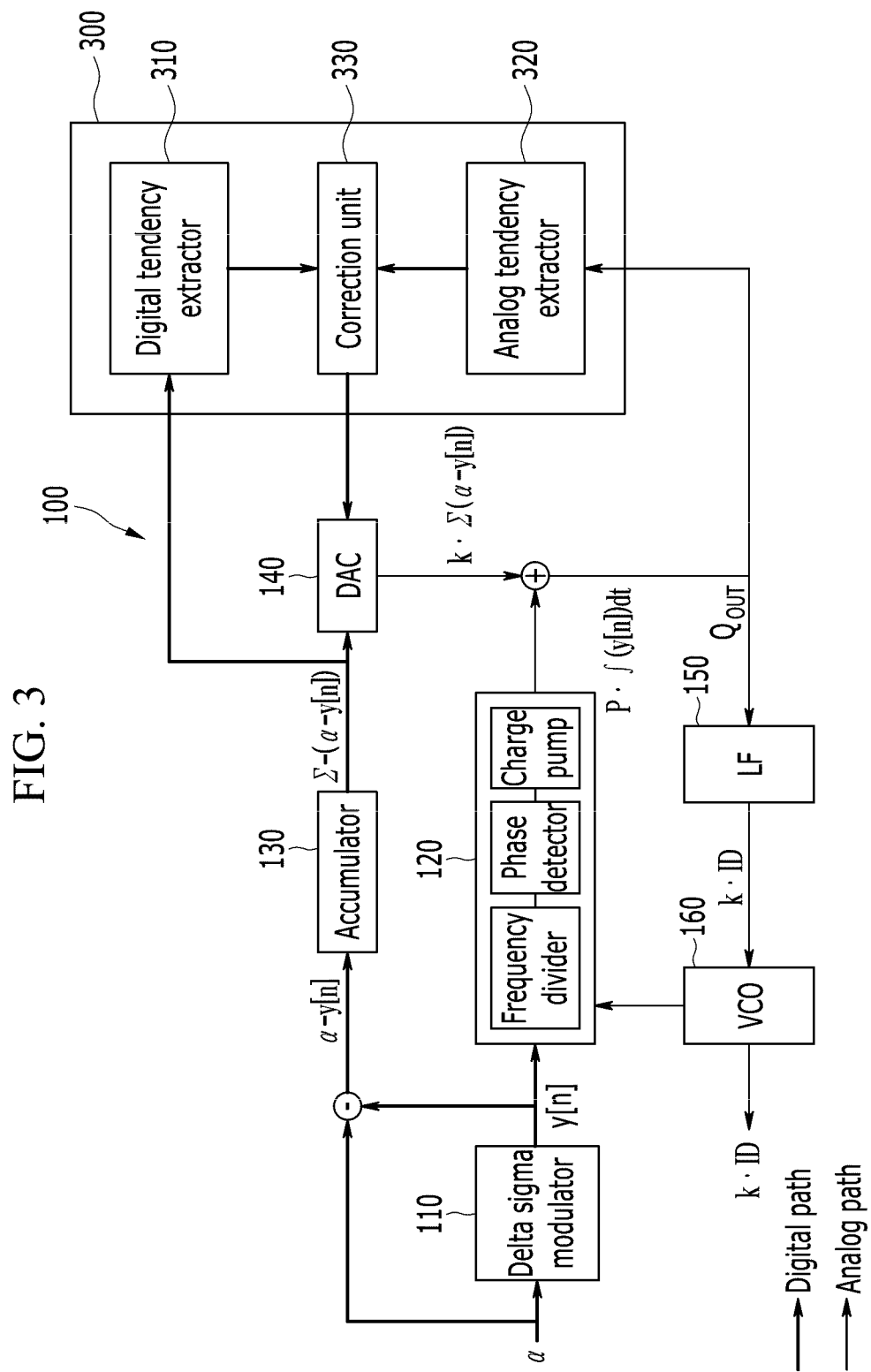
FIG. 3 is a block diagram illustrating a frequency synthesizer to which a correction loop is added according to an exemplary embodiment of the present invention.
Figure 4:
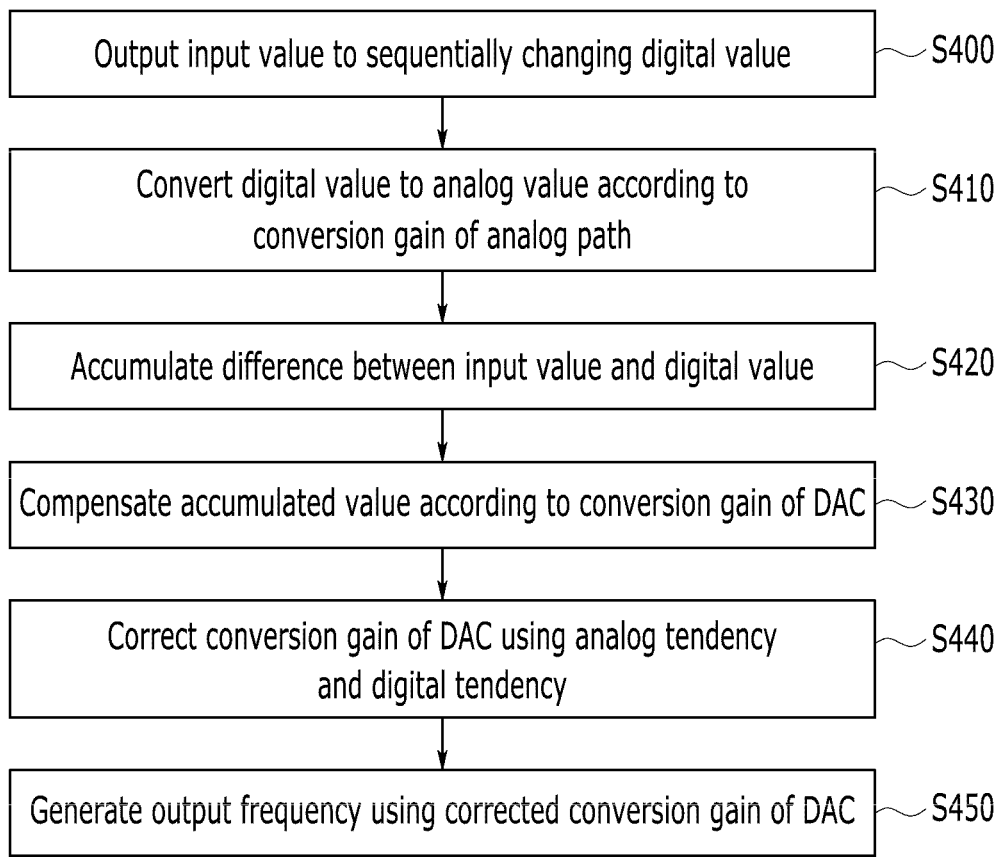
FIG. 4 is a flowchart illustrating a method in which a frequency synthesizer generates an output frequency according to an exemplary embodiment of the present invention.

FIG. 3 is a block diagram illustrating a frequency synthesizer to which a correction loop is added according to an exemplary embodiment of the present invention, and FIG. 4 is a flowchart illustrating a method in which a frequency synthesizer generates an output frequency according to an exemplary embodiment of the present invention. A detailed description of constituent elements identical to or corresponding to those of FIG. 1 will be omitted.

Referring to FIG. 3, the frequency synthesizer 100 further includes a correction loop 300. The correction loop 300 includes a digital tendency extractor 310, an analog tendency extractor 320, and a correction unit 330.

Referring to FIGS. 3 and 4, the delta sigma modulator 110 of the frequency synthesizer 100 outputs an input value α to a sequentially changing digital value y[n] (S400).

In an analog path, the analog path unit 120 converts the digital value y[n] to an analog value according to a conversion gain p (S410). In a digital path, the accumulator 130 accumulates a difference between the input value α and the digital value y[n] (S420), and the DAC 140 compensates an accumulated value according to a conversion gain k (S430).

Therefore, the correction loop 300 corrects a conversion gain k using analog tendency that is extracted from the analog value of step S410 and a compensation value of step S430 and digital tendency that is extracted from the accumulated value of step S420 (S440).

The LF 150 and the VCO 160 generate an output frequency using an analog value of step S410 and a compensation value according to a corrected conversion gain k of step S440 (S450).

Step in which the correction loop 300 of step S440 corrects the conversion gain k is specifically described. The digital tendency extractor 310 extracts digital tendency from an output value of the accumulator 130, the analog tendency extractor 320 extracts analog tendency from $Q_{OUT}$, and the correction unit 330 compares digital tendency of the digital tendency extractor 310 and analog tendency of the analog tendency extractor 320 and corrects the conversion gain k of the DAC 140.

Figure 5:
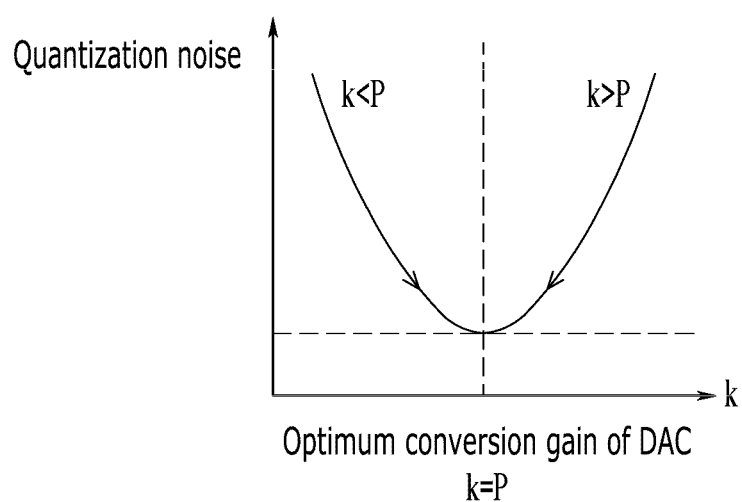
FIG. 5 is a graph illustrating a method in which a correction unit adjusts k.

That is, in Equation 1, if p is larger than k, $Q_{OUT}$ has a pattern of sequentially changing $\int y[n]dt$. However, if k is larger than p, $Q_{OUT}$ has a pattern of $\Sigma(\alpha-y[n])$. Therefore, when the correction unit 330 can find out each of a pattern of $Q_{OUT}$, which is analog tendency and a pattern of $\Sigma(\alpha-y[n])$, which is digital tendency, the correction unit 330 can adjust k. FIG. 5 is a graph illustrating a method in which the correction unit 330 adjusts k, and Table 1 is algorithm in which the correction unit 330 uses to adjust k.

TABLE 1 if(sgn{current_Qout – filtered_Qout}XOR sgn{current_Digital – filtered_Digital})
   count_K = count_K + 1;
else
   count_K = count_K –1;

Referring to FIG. 5 and Table 1, the correction unit 330 compares a pattern (current_Qout-filtered_Qout) of $Q_{OUT}$, which is analog tendency and a pattern (current_Digital-filtered_Digital) of $\Sigma(\alpha-y[n])$, which is digital tendency through an XOR operation. If analog tendency and digital tendency are not equal, the correction unit 330 increases a value k by 1, and if analog tendency and digital tendency are equal, the correction unit 330 reduces a value k by 1. Accordingly, k is converged to the same value as that of p.

Figure 6:
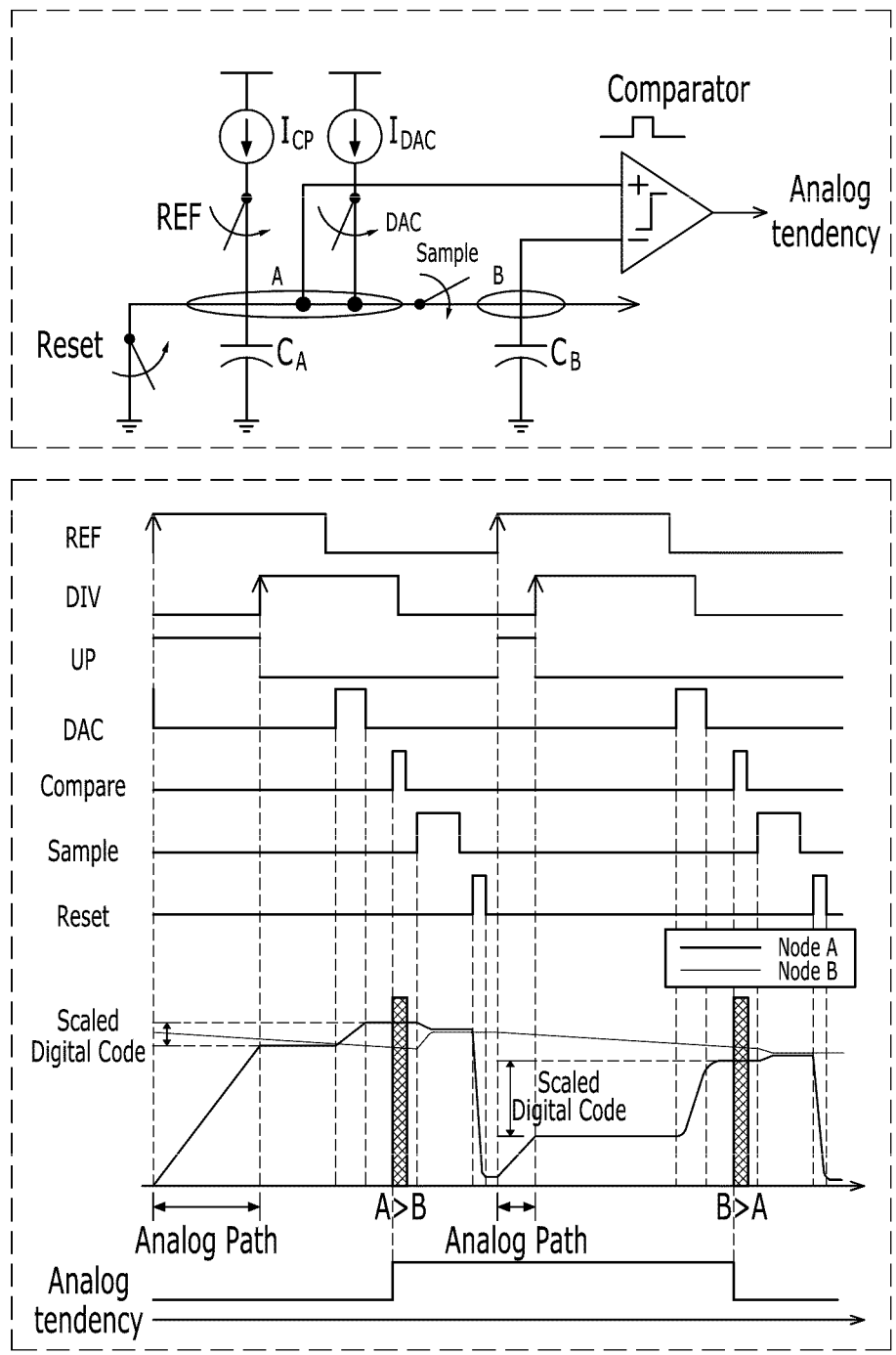
FIG. 6 is a circuit diagram and a timing diagram of a loop filter and an analog tendency extractor according to an exemplary embodiment of the present invention and illustrates a node voltage within the loop filter according to the timing diagram.

FIG. 6 is a circuit diagram and a timing diagram of an LF 150 and an analog tendency extractor 320 according to an exemplary embodiment of the present invention and illustrates a node voltage within the LF 150 according to the timing diagram.

Referring to FIG. 6, an UP signal that is generated by passing through a phase detector and the charge pump 120 of an analog path is charged to a capacitor $C_A$ within the LF 150. A DAC signal, which is a compensation signal that is generated by passing through the DAC 140 of a digital path is added to the capacitor $C_A$. Thereafter, a voltage value that is generated in the capacitor $C_A$ shares electric charges with a capacitor $C_B$ by a sample signal, and before a next REF signal enters, the capacitor $C_A$ is reset. Previously entered charge information is stored to capacitor $C_B$ with a ratio of the capacitor $C_A$ and the capacitor $C_B$, and charge information that is entered from past to present is averagely stored.

Thereafter, after the DAC signal is applied to the capacitor $C_A$, a comparator compares voltages of a node A and a node B. Accordingly, it can be determined whether an immediate previously applied DAC signal is larger or smaller than an average value.

That is, the LF 150 and the analog tendency extractor 320 add a voltage value that is generated by passing through an analog path and a voltage value that is compensated by passing through a digital path at a node A, and compare the added voltage value with a voltage value of a node B, which is a voltage value that is entered until a previous step. Accordingly, the LF 150 and the analog tendency extractor 320 determine whether compensation in the DAC 140 is appropriate and extract analog tendency.

Figure 7:
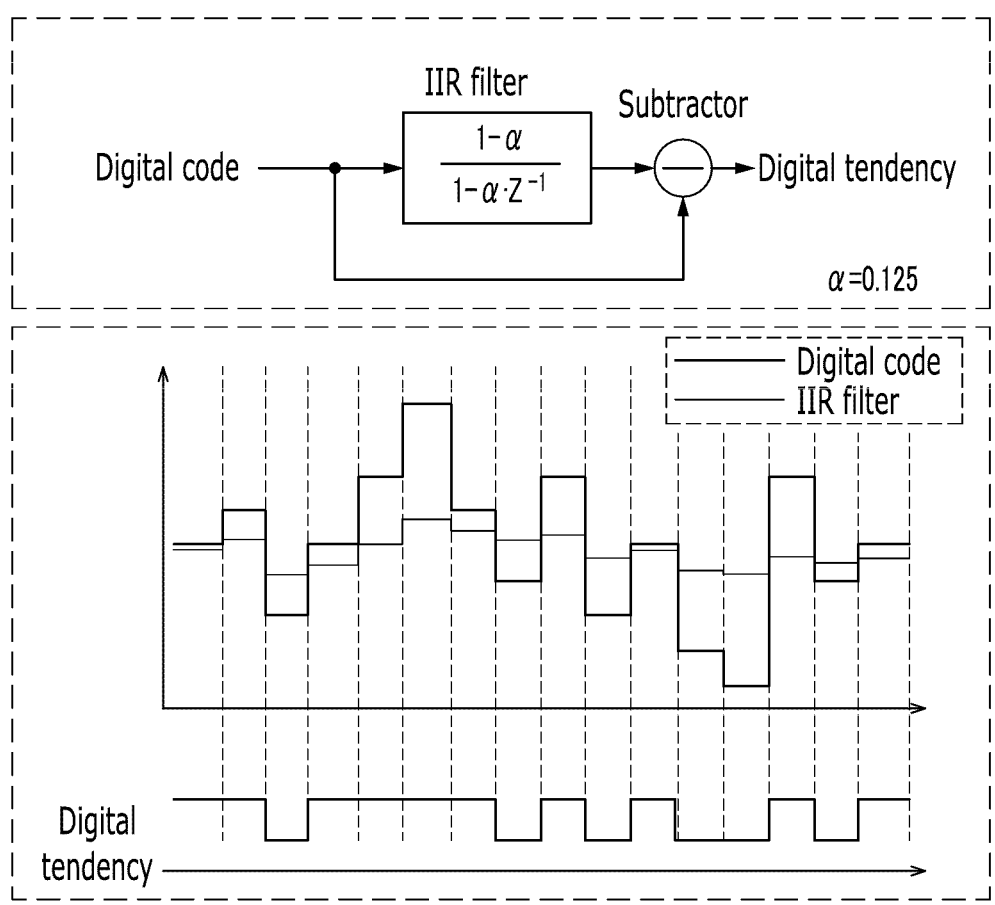
FIG. 7 is a diagram illustrating operation of a digital tendency extractor according to an exemplary embodiment of the present invention.

FIG. 7 is a diagram illustrating operation of a digital tendency extractor 310 according to an exemplary embodiment of the present invention.

Referring to FIG. 7, when a digital code that is output from the accumulator 130 passes through an IIR filter of the digital tendency extractor 310, an average value is obtained. A present digital code and an average value are compared using a subtractor, and digital tendency is extracted.

Figure 8:
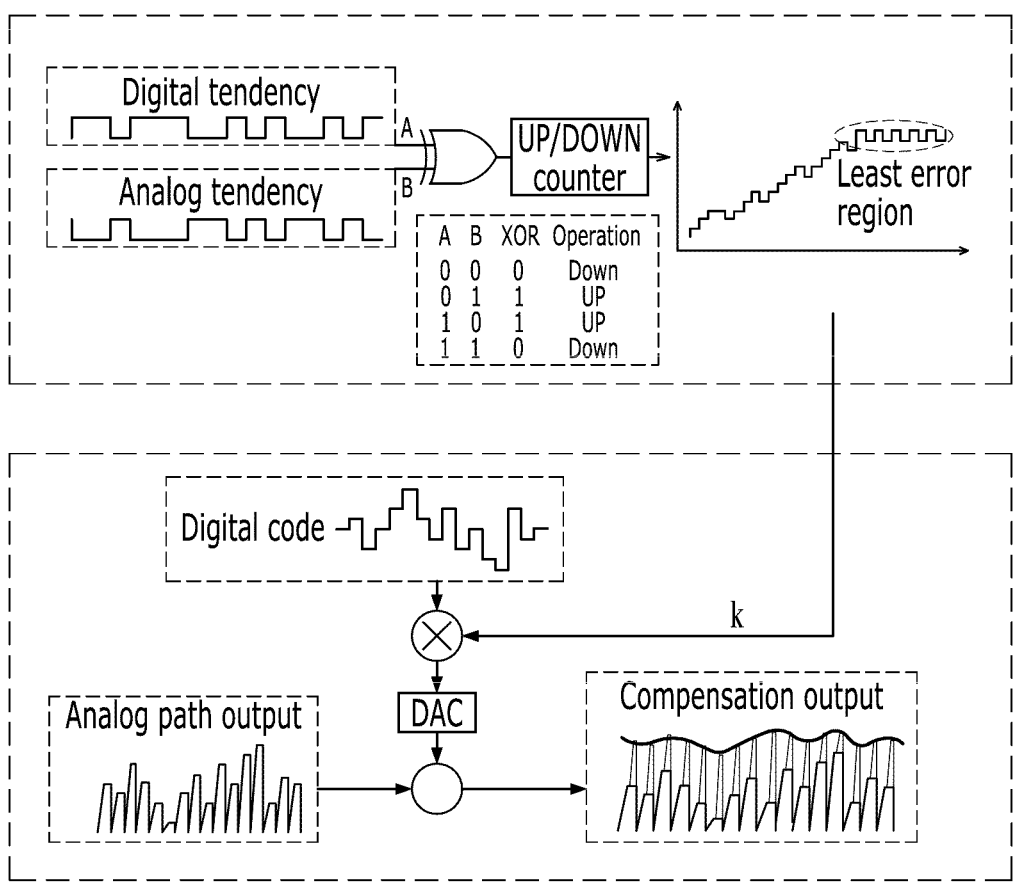
FIG. 8 is a diagram illustrating a method in which a correction unit adjusts a conversion gain k of a DAC using analog tendency and digital tendency according to an exemplary embodiment of the present invention.

FIG. 8 is a diagram illustrating a method in which the correction unit 330 adjusts a conversion gain k of a DAC using analog tendency and digital tendency according to an exemplary embodiment of the present invention.

Referring to FIG. 8, an XOR operation module of the correction unit 330 compares analog tendency and digital tendency. If analog tendency and digital tendency are equal, a coefficient module (UP/DOWN counter) of the correction unit 330 lowers a conversion gain k of the DAC 140, and if analog tendency and digital tendency are not equal, the coefficient module (UP/DOWN counter) raises a conversion gain k of the DAC 140.

By repeating several times this process, when k arrives in a least error region, the adjusted k is applied to the DAC. Accordingly, the frequency synthesizer 100 can generate output frequency in which quantization noise is minimized.

According to an exemplary embodiment of the present invention, an output frequency in which quantization noise is removed can be generated. For this purpose, a method of adjusting to equally set a conversion gain in an analog path of a frequency synthesizer and a conversion gain of a DAC can be obtained.

An exemplary embodiment of the present invention may be not only embodied through the above-described apparatus and/or method but also embodied through a program that executes a function corresponding to a configuration of the exemplary embodiment of the present invention or through a recording medium on which the program is recorded While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A frequency synthesizer comprising:
   a delta sigma modulator that outputs an input value to a sequentially changing digital value;

an analog path unit that converts the digital value to an analog value according to a first conversion gain;

an accumulator that accumulates a difference between the input value and the digital value;

a digital to analog converter (DAC) that compensates an output value of the accumulator according to a second conversion gain;

a correction loop that extracts analog tendency by adding an output of the analog path unit and an output of the DAC and that extracts digital tendency from an output of the accumulator and that adjusts the second conversion gain by comparing the analog tendency and the digital tendency; and a voltage control oscillator that generates an output frequency using a output of a loop filter that is extracted from a adding value of an output of the analog path unit and an output according to an adjusted second conversion gain of the DAC.

2. The frequency synthesizer of claim 1, wherein the correction loop comprises an analog tendency extractor that extracts the analog tendency;

a digital tendency extractor that extracts digital tendency; and a correction unit that adjusts the second conversion gain so that the first conversion gain and the second conversion gain become the same by comparing the analog tendency and the digital tendency.

3. The frequency synthesizer of claim 2, wherein the correction unit increases the second conversion gain, if the analog tendency and the digital tendency are not equal and reduces the second conversion gain, if the analog tendency and the digital tendency are equal.

4. The frequency synthesizer of claim 2, wherein the correction unit compares the analog tendency and the digital tendency using an exclusive OR (XOR) operation.

5. The frequency synthesizer of claim 2, wherein the analog tendency extractor extracts the analog tendency by comparing a present value and an average value of the sum of an output of the analog path unit and an output of the DAC.

6. The frequency synthesizer of claim 2, wherein the digital tendency extractor extracts the digital tendency by comparing a present output and an average output of the accumulator.

7. A method of generating an output frequency of a frequency synthesizer, the method comprising:

outputting an input value to a sequentially changing digital value;

converting the digital value to an analog value according to a first conversion gain;

accumulating a difference between the input value and the digital value;

compensating the accumulated value according to a second conversion gain;

correcting the second conversion gain using analog tendency that is extracted from the analog value and a compensated value according to the second conversion gain and digital tendency that is extracted from the accumulated value; and generating an output frequency using a value that is adding the analog value and a compensated value according to a corrected second conversion gain.

8. The method of claim 7, wherein the correcting of the second conversion gain comprises extracting the analog tendency by adding the analog value and a compensated value according to the second conversion gain;

extracting digital tendency from the accumulated value; and adjusting the second conversion gain so that the first conversion gain and the second conversion gain may become the same by comparing the analog tendency and the digital tendency.

9. The method of claim 8, wherein the adjusting of the second conversion gain comprises comparing the analog tendency and the digital tendency; and increasing, if the analog tendency and the digital tendency are not equal, the second conversion gain, and reducing, if the analog tendency and the digital tendency are equal, the second conversion gain.

10. The method of claim 9, wherein the comparing of the analog tendency comprises performing an XOR operation of the analog tendency and the digital tendency.

11. A method of correcting a conversion gain of a frequency synthesizer, the method comprising:

generating an analog value from a digital value that is output from a delta sigma modulator;

generating a compensation value using a accumulated value from the digital value and a predetermined conversion gain of a DAC;

extracting analog tendency from the analog value and the compensation value;

extracting digital tendency from the digital value; and correcting a conversion gain of the DAC from the analog tendency and the digital tendency.

12. The method of claim 11, wherein the correcting of a conversion gain comprises increasing, if the analog tendency and the digital tendency are not equal, the conversion gain, and reducing, if the analog tendency and the digital tendency are equal, the conversion gain.

13. The method of claim 11, wherein the correcting of a conversion gain comprises comparing the analog tendency and the digital tendency using an XOR operation.

14. The method of claim 11, wherein the extracting of the analog tendency comprises extracting the analog tendency by comparing a present value and an average value of the sum of the analog value and the compensation value.

15. The method of claim 11, wherein the extracting of digital tendency comprises extracting the digital tendency by comparing a present value and an average value of the digital value.

* * * * *